(12) United States Patent
Li

(10) Patent No.: US 10,978,360 B2
(45) Date of Patent: Apr. 13, 2021

(54) PNA TEMPERATURE MONITORING METHOD

(71) Applicant: Shanghai Huali Integrated Circuit Corporation, Shanghai (CN)

(72) Inventor: Zhonghua Li, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 7 days.

(21) Appl. No.: 16/702,924

(22) Filed: Dec. 4, 2019

(65) Prior Publication Data

US 2021/0028072 A1 Jan. 28, 2021

(30) Foreign Application Priority Data

Jul. 24, 2019 (CN) .......................... 201910670110.1

(51) Int. Cl.
*H01L 21/00* (2006.01)
*H01L 21/66* (2006.01)
(Continued)

(52) U.S. Cl.
CPC ........ *H01L 22/20* (2013.01); *H01L 21/28185* (2013.01); *H01L 21/28211* (2013.01);
(Continued)

(58) Field of Classification Search
CPC .............. H01L 22/20; H01L 21/28185; H01L 21/28211; H01L 23/544; H01L 21/02247;
(Continued)

(56) References Cited

U.S. PATENT DOCUMENTS

2005/0069790 A1  3/2005 Gruss et al.
2005/0272221 A1  12/2005 Yen et al.
(Continued)

FOREIGN PATENT DOCUMENTS

CN   101593744 A   12/2009
CN   102738121 A   10/2012
(Continued)

OTHER PUBLICATIONS

Feb. 25, 2021—(CN) CNIPA First Search Report Appn 201910670110.1.

*Primary Examiner* — Richard A Booth
(74) *Attorney, Agent, or Firm* — Banner & Witcoff, Ltd.

(57) ABSTRACT

A PNA temperature monitoring method comprises: Step 1, forming zero mark layer patterns on a tested silicon substrate; Step 2, forming a nitrogen-doped gate oxide by the following process: growing an oxide layer, doping the oxide layer with nitrogen, and carrying out PNA; Step 3, forming overlay layer patterns, and overlaying the overlay layer patterns and the corresponding zero mark layer patterns to form monitoring structures; and Step 4, measuring overlay values of the overlay layer patterns and the corresponding zero mark layer patterns of the monitoring structures, and regulating a PNA temperature according to the measured overlay values. By adoption of the method, the influence of the PNA temperature on a gate oxide in a two-dimensional plane can be monitored, and then the PNA temperature can be regulated to increase product yield.

17 Claims, 3 Drawing Sheets

(51) Int. Cl.
*H01L 21/28* (2006.01)
*H01L 23/544* (2006.01)
*H01L 21/02* (2006.01)
*H01L 21/3065* (2006.01)
*H01L 21/311* (2006.01)

(52) U.S. Cl.
CPC ...... *H01L 23/544* (2013.01); *H01L 21/02247* (2013.01); *H01L 21/02252* (2013.01); *H01L 21/3065* (2013.01); *H01L 21/31116* (2013.01)

(58) Field of Classification Search
CPC ........... H01L 21/02252; H01L 21/3065; H01L 21/31116
See application file for complete search history.

(56) References Cited

U.S. PATENT DOCUMENTS

| | | | |
|---|---|---|---|
| 2006/0172490 A1* | 8/2006 | Jeng | H01L 29/66825 438/257 |
| 2011/0204454 A1* | 8/2011 | Chambers | H01L 29/513 257/411 |
| 2012/0032280 A1* | 2/2012 | Kirkpatrick | H01L 21/28202 257/411 |

FOREIGN PATENT DOCUMENTS

| | | |
|---|---|---|
| CN | 103901729 A | 7/2014 |
| CN | 105223781 A | 1/2016 |
| CN | 108089412 A | 5/2018 |

* cited by examiner

PNA TEMPERATURE MONITORING METHOD

CROSS REFERENCE TO RELATED APPLICATIONS

The present application claims priority to and the benefit of Chinese Patent Application No. 201910670110.1 filed on Jul. 24, 2019, the disclosure of which is incorporated herein by reference in its entirety as part of the present application.

BACKGROUND

A gate dielectric layer is generally adopted by the gate structure of MOSFET which serves as the basic device of a semiconductor device circuit, and in most cases, the gate dielectric layer is a gate oxide made from SiO2 and formed by oxidization of a silicon substrate. With the continuous development of the semiconductor integrated circuit manufacturing technology and the constant scaling-down of the characteristic dimension of devices, the thickness of the gate oxide of MOSFET decreases accordingly, which in turn increases the gate capacitance, thus increasing the drive current of MOSFET and improving device performance.

However, when the process node of the semiconductor technology is less than 90 nm, the thickness of the gate oxide will decrease to 20 Å or below, and once the gate oxide is too thin, the gate-drain current will be increased, and impurities of a polysilicon gate in the gate structure may penetrate through the gate oxide to permeate into the silicon substrate. Therefore, the thickness decrease of the gate oxide should not exceed a lower limit In order to maintain the gate capacitance without decreasing the thickness of the gate dielectric layer, the dielectric coefficient (K) of the gate dielectric layer should be increased in general, wherein one method for increasing the dielectric coefficient (K) of the gate dielectric layer is to use a material which is different from the gate oxide, namely a high-K (HK) material such as HfSiON, as the gate dielectric layer. However, the formation process of the HK material is complex, the cost is high, and the development cycle is long.

In view of this, an existing common method is to dope the gate oxide with nitrogen to replace part of oxygen in SiO2 with N so as to turn SiO2 into SiON. Because the K value of the gate oxide will be increased after the gate oxide is doped with nitrogen, the device performance can be improved without decreasing the thickness of the gate oxide, and the situation that the gate-drain current is increased and the impurities of the polysilicon gate are diffused into the silicon substrate via the gate oxide due to the thickness decrease of the gate oxide is prevented.

An existing method for forming a nitrogen-doped gate oxide typically comprises the following steps:

First, a silicon substrate is oxidized by in-situ steam generation (ISSG) to form an oxide layer (namely SiO2 layer), wherein the ISSG process is generally implemented in such a manner: a small quantity of hydrogen is added to oxygen to serve as a catalyst, the oxygen reacts with the hydrogen to generate steam and free-radical oxygen atoms, and the free-radical oxygen atoms react with silicon to form SiO2.

Afterwards, the oxide layer is doped with nitrogen by a decoupled plasma nitridation (DPN) process, that is, plasma generated by oxygen is doped into SiO2.

Finally, post nitridation anneal (PNA) is carried out to stabilize nitrogen impurities (namely Si—N bonds) doped by the DPN process to repair the gate oxide damaged under the effect of the plasma.

Among the processes adopted in the above three steps, the process conditions of PNA have an influence on the distribution of stable Si—N bonds in the gate oxide, which in turn greatly influences the performance of the gate oxide, and thus, it is of great importance to regulate the process conditions of PNA such as the anneal temperature. Before the regulation of the process conditions of PNA, process fluctuations of PNA should be monitored first, and then the process conditions are regulated according to a monitoring result.

At present, fluctuations of the PNA temperature are monitored by observing changes of the thickness of the gate oxide in a Z direction of an optical substrate, namely a tested silicon substrate. Particularly, after a gate oxide is formed in the tested silicon substrate by ISSG, DPN and PNA, the thickness of the gate oxide is measured, and then the fluctuations of the PNA temperature are monitored according to changes of the thickness of the gate oxide; and because the thickness direction is perpendicular to the surface of the tested silicon substrate, the thickness is a value of the Z direction.

However, the fluctuations of the PNA temperature may also influence the gate oxide in a two-dimensional plane, while such influence cannot be monitored yet in the prior art.

BRIEF SUMMARY

The technical issue to be settled by the invention is to provide a PNA temperature monitoring method. By adoption of the PNA temperature monitoring method, the influence of the PNA temperature on a gate oxide in a two-dimensional plane can be monitored, and the PNA temperature can be regulated according to the influence to increase product yield.

To settle the above technical issue, the PNA temperature monitoring method of the invention comprises the following steps:

Step 1, forming zero mark layer patterns on a tested silicon substrate;

Step 2, forming a nitrogen-doped gate oxide on the surface of the tested silicon substrate formed with the zero mark layer patterns by the following process: growing an oxide layer, doping the oxide layer with nitrogen, and carrying out PNA;

Step 3, forming overlay layer patterns on the surface of the gate oxide, and overlaying (OVL) the overlay layer patterns and the corresponding zero mark layer patterns to form monitoring structures, wherein overlay values of the overlay layer patterns and the corresponding zero mark layer patterns in the monitoring structures are values in an X-direction and a Y-direction parallel to the surface of the tested silicon substrate; and Step 4, measuring the overlay values of the overlay layer patterns and the corresponding zero mark layer patterns of the monitoring structures on the tested silicon substrate, and regulating a PNA temperature according to the measured overlay values.

Furthermore, the zero mark layer patterns are formed in Step 1 through the following steps:

Step 11, forming a hard mask layer on the surface of the tested silicon substrate;

Step 12, coating the surface of the hard mask layer with a zero mark layer photoresist, and exposing and developing the zero mark layer photoresist;

Step 13, sequentially etching the hard mask layer and the tested silicon substrate with the developed zero mark layer photoresist as a mask to form trenches, and then removing the zero mark layer photoresist; and Step 14, filling the trenches with a first dielectric layer, and forming the zero mark layer patterns by the first dielectric layer in the trenches.

Furthermore, the first dielectric layer extends to the surface of the hard mask layer outside the trenches while growing to fill in the trenches in Step 14;

Afterwards, the first dielectric layer is polished by a chemical mechanical polishing process with the hard mask layer as an endpoint to remove the first dielectric layer outside the trenches; and Afterwards, the hard mask layer is removed.

Furthermore, the hard mask layer formed in Step 11 is made from silicon nitride, is formed by a chemical vapor deposition process or a furnace process, and has a thickness of 30 Å-80 Å.

Furthermore, the zero mark layer photoresist adopted in Step 12 has a thickness of 10000 Å-20000 Å.

Furthermore, the trenches formed in Step 13 have a depth of 1000 Å-3000 Å.

Furthermore, the hard mask layer and the tested silicon substrate are etched by a plasma etching process to form the trenches in Step 13, and the zero mark layer photoresist and etching residues generated in the trenches by the plasma etching process are synchronously removed by a wet etching process.

Furthermore, the first dielectric layer is made from an oxide.

Furthermore, the first dielectric layer grows by a high-density plasma process or a high-aspect ratio process and has a thickness of 3000 Å-6000 Å; and After the first dielectric layer grows, the first dielectric layer is annealed at a temperature of 1000° C. by furnace annealing or rapid thermal annealing.

Furthermore, in the process of forming the gate oxide in Step 2:

The oxide layer grows by an in-situ steam generation process; and

The oxide layer is doped with nitrogen by a decoupled plasma nitridation process.

Furthermore, in Step 3, an overlay layer photoresist is coated and then is exposed and developed, and the overlay layer patterns are formed by the developed overlay layer photoresist.

Furthermore, the overlay layer photoresist has a thickness of 2000 Å-3000 Å.

Furthermore, the zero mark layer patterns are strip structures when looked from above, and the strip structures of the zero mark layer patterns have a length of 12-16 μm and a width of 1-4 μm;

The overlay layer patterns are strip structures when looked from above, and the strip structures of the overlay layer patterns have a length of 8-12 μm and a width of 1-4 μm; and Each monitoring structure includes multiple zero mark layer patterns and multiple overlay layer patterns, wherein the multiple zero mark layer patterns surround the multiple overlay layer patterns, and the multiple overlay layer patterns are arrayed to form an annular structure.

Furthermore, each monitoring structure includes four zero mark layer patterns and four overlay layer patterns, wherein the four overlay layer patterns are arrayed to form a square annular structure, and the four zero mark layer patterns are arrayed around the multiple overlay layer patterns to form a square annular structure.

Furthermore, the monitoring structures are distributed in the central area and the periphery of the test silicon substrate.

In order to monitor the influence of the PNA temperature on a gate oxide in a two-dimensional plane, the monitoring method in the invention is designed in a targeted manner; different from a PNA temperature monitoring method, in the prior art, that a gate oxide is directly formed on a tested silicon substrate and then the thickness of the gate oxide is tested to monitor the PNA temperature, in the invention, zero mark layer patterns are formed on a tested silicon substrate first, then a nitrogen-doped gate oxide is formed, and then a layer of overlay layer patterns are formed and overlay with the corresponding zero mark layer patterns to form monitoring structures; and because the overlay values of the overlay layer patterns and the corresponding zero mark layer patterns in the monitoring structures are values in the X-direction and the Y-direction parallel to the surface of the tested silicon substrate, the influence of the PNA temperature on the gate oxide in a two-dimensional plane can be monitored by measuring the overlay values of the overlay layer patterns and the corresponding zero mark layer patterns of the monitoring structures, and then the PNA temperature is regulated according to the measured overlay values to improve the overlay precision of products and to increase product yield.

BRIEF DESCRIPTION OF THE DRAWINGS

The invention is further detailed below in combination with the accompanying drawings and embodiments.

DETAILED DESCRIPTION

Figure 1:
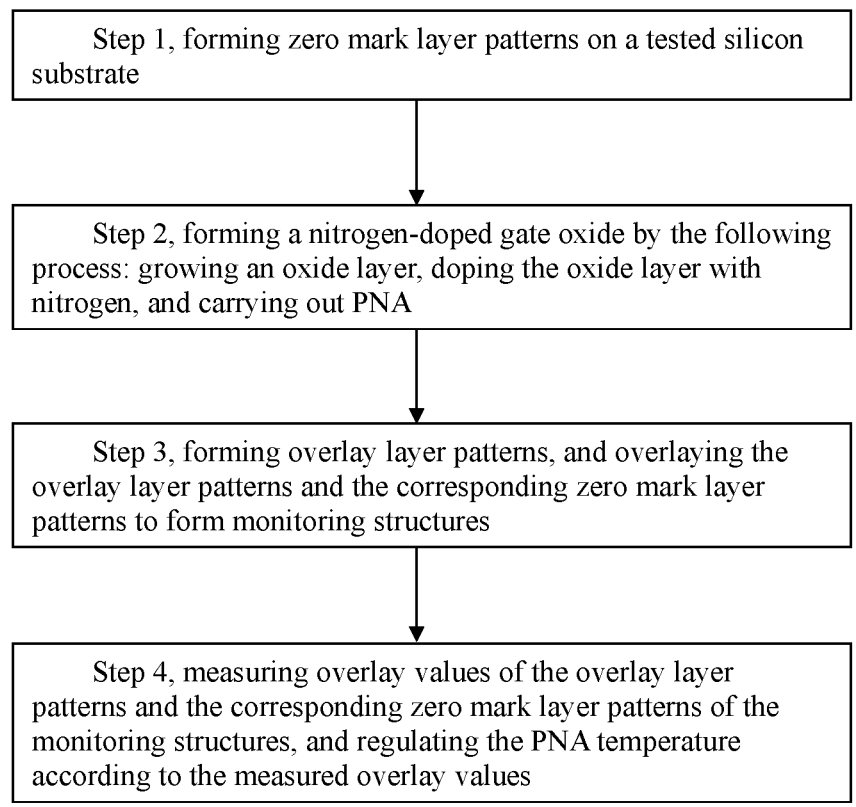
FIG. 1 is a flow diagram of a PNA temperature monitoring method in one embodiment of the invention.

As shown in FIG. 1 which is a flow diagram of a PNA temperature monitoring method in one embodiment of the invention and FIG. 2A to FIG. 2J which are device structural diagrams of all steps of the method in the embodiment of the invention, the PNA temperature monitoring method comprises the following steps:

Step 1, zero mark layer patterns 2 are formed in a tested silicon substrate 1.

Figure 2A:
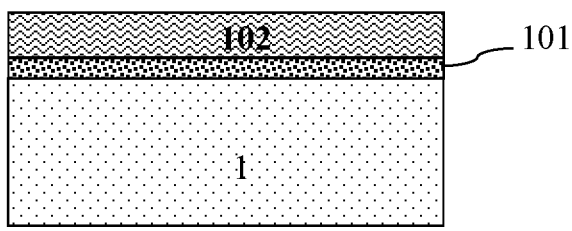
FIG. 2A-FIG. 2J are device structural diagram of all steps of the method in the embodiment of the invention.

In this embodiment of the invention, the zero mark layer patterns 2 are formed through the following steps:

Step 11, as shown in FIG. 2A, a hard mask layer 101 is formed on the surface of the tested silicon substrate 1.

The hard mask layer 101 is made from silicon nitride, is formed by a chemical vapor deposition process or a furnace process, and has a thickness of 30 Å-80 Å.

Step 12, as shown in FIG. 2A, the surface of the hard mask layer 101 is coated with a zero mark layer photoresist 102.

Figure 2B:
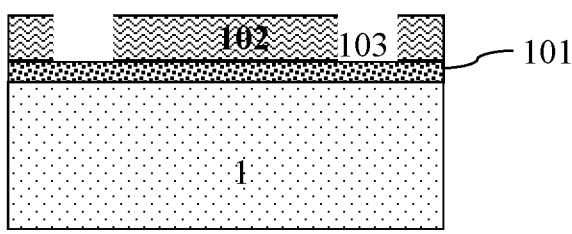

As shown in FIG. 2B, the zero mark layer photoresist 102 is exposed and developed, and open regions 103 formed after the zero mark layer photoresist 102 is developed are formation regions of the zero mark layer patterns 2.

The zero mark layer photoresist 102 has a thickness of 10000 Å-20000 Å.

Figure 2C:
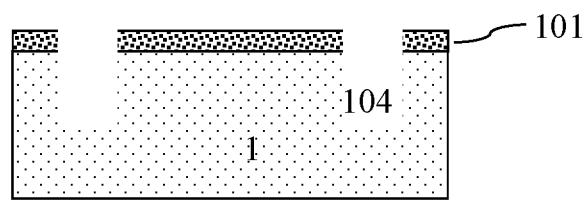

Step 13, as shown in FIG. 2C, the hard mask layer 101 and the tested silicon substrate 1 are sequentially etched with the developed zero mark layer photoresist 102 as a mask to form trenches 104, and then the zero mark layer photoresist 102 is removed. The trenches 104 have a depth of 1000 Å-3000 Å.

The hard mask layer 101 and the tested silicon substrate 1 are etched by a plasma etching process to form the trenches 104, and the zero mark layer photoresist 102 and etching residues generated in the trenches 104 by the plasma etching process are synchronously removed by a wet etching process.

Step 14, the trenches 104 are filled with first dielectric layer 2, and the zero mark layer patterns 2 are formed by the first dielectric layer 104 filling in the trenches 104.

Figure 2D:
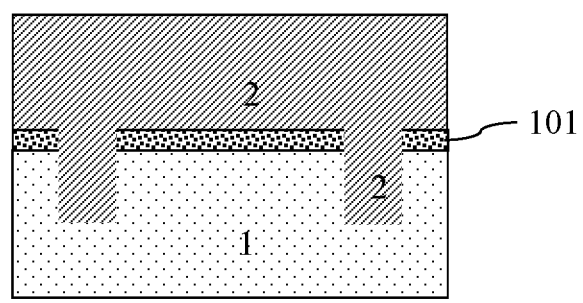

As shown in FIG. 2D, the first dielectric layer 2 extends to the surface of the hard mask layer 101 outside the trenches 104 while growing to fill in the trenches 104.

Preferably, the first dielectric layer 2 is made from an oxide, grows by a high-density plasma process or a high-aspect ratio process, and has a thickness of 3000 Å-6000 Å. After the first dielectric layer 2 grows, the first dielectric layer 2 is annealed at a temperature of 1000° C. by furnace annealing or rapid thermal annealing.

Figure 2E:
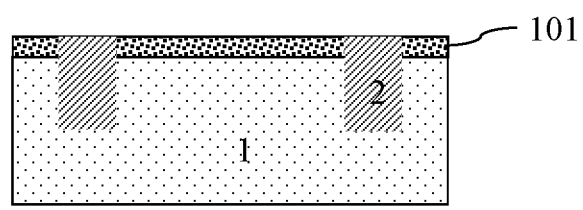
Figure 2F:
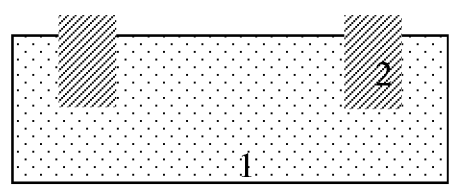
Figure 2G:
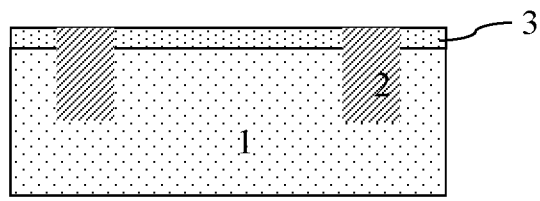

As shown in FIG. 2E, afterwards, the first dielectric layer 2 is polished by a chemical mechanical polishing process with the hard mask layer 101 as an endpoint to remove the first dielectric layer 2 outside the trenches 104.

Afterwards, the hard mask layer 101 is removed through the following steps: the surface of the hard mask layer 101 is treated with hydrofluoric acid to remove an oxide layer possibly left on the surface of the surface of the hard mask layer 101, and then the hard mask layer is removed with phosphoric acid.

Step 2, a nitrogen-doped gate oxide 3 is formed on the surface of the tested silicon substrate 1 formed with the zero mark layer patterns, and the gate oxide 3 is formed through the following process:

An oxide layer grows, wherein in this embodiment, the oxide layer grows by an in-situ steam generation process;

The oxide layer is doped with nitrogen, wherein in this embodiment, the oxide layer is doped with nitrogen by a decoupled plasma nitridation process; and PNA is carried out.

Step 3, overlay layer patterns 4 are formed on the surface of the gate oxide 3 and overlay with the corresponding zero mark layer patterns 2 to form monitoring structures 5, wherein overlay values of the overlay layer patterns 4 and the corresponding zero mark layer patterns 2 in the monitoring structures 5 are values of an X-direction and a Y-direction parallel to the surface of the tested silicon substrate 1.

Figure 2H:
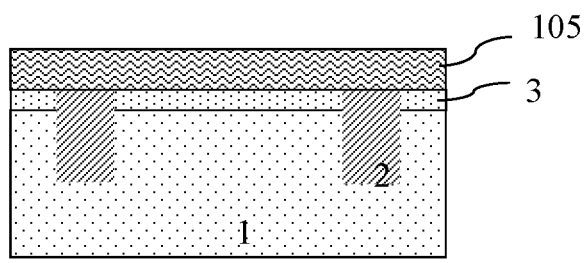
Figure 2I:
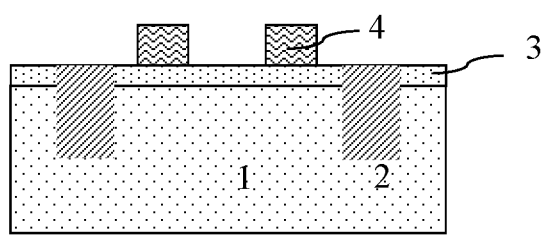

In this embodiment, the overlay layer patterns 4 are formed through the following steps: as shown in FIG. 2H, an overlay layer photoresist 105 is coated; and as shown in FIG. 2I, the overlay layer photoresist 105 is exposed and developed, and the overlay layer patterns 4 are formed by the developed overlay layer photoresist 105.

The overlay layer photoresist 105 has a thickness of 2000 Å-3000 Å.

Figure 2J:
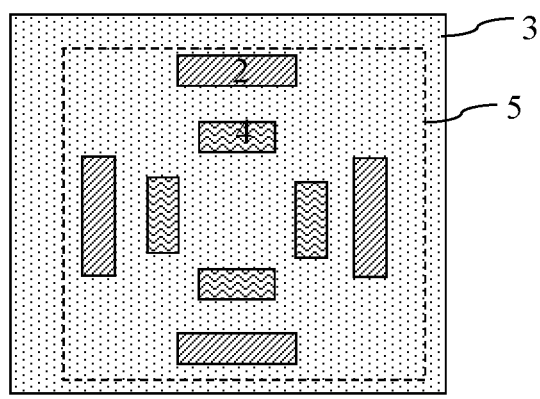

As shown in FIG. 2J, the zero mark layer patterns 2 are strip structures when looked from above, and the strip structures of the zero mark layer patterns 2 have a length of 12-16 μm and a width of 1-4 μm.

The overlay layer patterns 4 are strip structures when looked from above, and the strip structures of the overlay layer patterns 4 have a length of 8-12 μm and a width of 1-4 μm.

Each monitoring structure 5 includes multiple zero mark layer patterns 2 and multiple overlay layer patterns 4, wherein the multiple zero mark layer patterns 2 surround the multiple overlay layer patterns 4, and the multiple overlay layer patterns 4 are arrayed to form an annular structure. In FIG. 2J, each monitoring structure 5 includes four zero mark layer patterns 2 and four overlay layer patterns 4, wherein the four overlay layer patterns are arrayed to form a square annular structure, and the four zero mark layer patterns 2 are arrayed around the multiple overlay layer patterns 4 to form a square annular structure.

The monitoring structures 5 are distributed in the central area and the periphery of the test silicon substrate 1, so that all regions of the surface of the tested silicon substrate 1 can be monitored.

Step 4, the overlay values of the overlay layer patterns 4 and the corresponding zero mark layer patterns 2 of the monitoring structures 5 on the tested silicon substrate 1 are measured, and the PNA temperature is regulated according to the measured overlay values.

In order to monitor the influence of the PNA temperature on the gate oxide 3 in a two-dimensional plane, the monitoring method in this embodiment of the invention is designed in a targeted manner; different from a PNA temperature monitoring method, in the prior art, that a gate oxide 3 is directly formed on a tested silicon substrate 1 and then the thickness of the gate oxide 3 is tested to monitor the PNA temperature, in this embodiment of the invention, zero mark layer patterns 2 are formed on a tested silicon substrate 1 first, then a nitrogen-doped gate oxide 3 is formed, and then a layer of overlay layer patterns 4 are formed and overlay with the corresponding zero mark layer patterns 2 to form monitoring structures 5; and because the overlay values of the overlay layer patterns 4 and the corresponding zero mark layer patterns 2 in the monitoring structures 5 are values in the X-direction and the Y-direction parallel to the surface of the tested silicon substrate 1, the influence of the PNA temperature on the gate oxide 3 in a two-dimensional plane can be monitored by measuring the overlay values of the overlay layer patterns 4 and the corresponding zero mark layer patterns 2 of the monitoring structures 5, and then the PNA temperature is regulated according to the measured overlay values to improve the overlay precision of products and to increase product yield.

The invention is detailed above with reference to embodiments, but these embodiments are not intended to limit the invention. Various transformations and improvements can be made by those skilled in the art without deviating from the principle of the invention, and all these transformations and improvements should also fall within the protection scope of the invention.

What is claimed is:

1. A PNA temperature monitoring method, comprising the following steps:
   Step 1, forming zero mark layer patterns on a tested silicon substrate;
   Step 2, forming a nitrogen-doped gate oxide on a surface of the tested silicon substrate formed with the zero mark layer patterns by the following process: growing an oxide layer, doping the oxide layer with nitrogen, and carrying out PNA;
   Step 3, forming overlay layer patterns on a surface of the gate oxide, and overlaying the overlay layer patterns and the corresponding zero mark layer patterns to form monitoring structures, wherein overlay values of the overlay layer patterns and the corresponding zero mark layer patterns in the monitoring structures are values in an X-direction and a Y-direction parallel to the surface of the tested silicon substrate; and Step 4, measuring the overlay values of the overlay layer patterns and the corresponding zero mark layer patterns of the monitoring structures on the tested silicon substrate, and regulating a PNA temperature according to the measured overlay values.

2. The PNA temperature monitoring method according to claim 1, wherein the zero mark layer patterns are formed in Step 1 through the following steps:

Step 11, forming a hard mask layer on the surface of the tested silicon substrate;

Step 12, coating a surface of the hard mask layer with a zero mark layer photoresist, and exposing and developing the zero mark layer photoresist;

Step 13, sequentially etching the hard mask layer and the tested silicon substrate with the developed zero mark layer photoresist as a mask to form trenches, and then removing the zero mark layer photoresist; and Step 14, filling the trenches with a first dielectric layer, and forming the zero mark layer patterns by the first dielectric layer in the trenches.

3. The PNA temperature monitoring method according to claim 2, wherein the first dielectric layer extends to the surface of the hard mask layer outside the trenches while growing to fill in the trenches in Step 14;

afterwards, the first dielectric layer is polished by a chemical mechanical polishing process with the hard mask layer as an endpoint to remove the first dielectric layer outside the trenches; and afterwards, the hard mask layer is removed.

4. The PNA temperature monitoring method according to claim 3, wherein the hard mask layer formed in Step 11 is made from silicon nitride, is formed by a chemical vapor deposition process or a furnace process, and has a thickness of 30 Å-80 Å.

5. The PNA temperature monitoring method according to claim 2, wherein the zero mark layer photoresist adopted in Step 12 has a thickness of 10000 Å-20000 Å.

6. The PNA temperature monitoring method according to claim 2, wherein the trenches formed in Step 13 have a depth of 1000 Å-3000 Å.

7. The PNA temperature monitoring method according to claim 2, wherein the hard mask layer and the tested silicon substrate are etched by a plasma etching process to form the trenches in Step 13, and the zero mark layer photoresist and etching residues generated in the trenches by the plasma etching process are synchronously removed by a wet etching process.

8. The PNA temperature monitoring method according to claim 4, wherein the first dielectric layer is made from an oxide.

9. The PNA temperature monitoring method according to claim 8, wherein the first dielectric layer grows by a high-density plasma process or a high-aspect ratio process and has a thickness of 3000 Å-6000 Å; and after the first dielectric layer grows, the first dielectric layer is annealed at a temperature of 1000° C. by furnace annealing or rapid thermal annealing.

10. The PNA temperature monitoring method according to claim 1, wherein in the process of forming the gate oxide in Step 2:

the oxide layer grows by an in-situ steam generation process; and the oxide layer is doped with nitrogen by a decoupled plasma nitridation process.

11. The PNA temperature monitoring method according to claim 1, wherein in Step 3, an overlay layer photoresist is coated and then is exposed and developed, and the overlay layer patterns are formed by the developed overlay layer photoresist.

12. The PNA temperature monitoring method according to claim 11, wherein the overlay layer photoresist has a thickness of 2000 Å-3000 Å.

13. The PNA temperature monitoring method according to claim 1, wherein the zero mark layer patterns are strip structures when looked from above, and the strip structures of the zero mark layer patterns have a length of 12-16 μm and a width of 1-4 μm;

the overlay layer patterns are strip structures when looked from above, and the strip structures of the overlay layer patterns have a length of 8-12 μm and a width of 1-4 μm; and each said monitoring structure includes multiple said zero mark layer patterns and multiple said overlay layer patterns, wherein the multiple zero mark layer patterns surround the multiple overlay layer patterns, and the multiple overlay layer patterns are arrayed to form an annular structure.

14. The PNA temperature monitoring method according to claim 13, wherein each said monitoring structure includes four said zero mark layer patterns and four said overlay layer patterns, wherein the four overlay layer patterns are arrayed to form a square annular structure, and the four zero mark layer patterns are arrayed around the multiple overlay layer patterns to form a square annular structure.

15. The PNA temperature monitoring method according to claim 1, wherein the monitoring structures are distributed in a central area and a periphery of the test silicon substrate.

16. The PNA temperature monitoring method according to claim 13, wherein the monitoring structures are distributed in a central area and a periphery of the test silicon substrate.

17. The PNA temperature monitoring method according to claim 14, wherein the monitoring structures are distributed in a central area and a periphery of the test silicon substrate.

* * * * *